(12) United States Patent
Boehm

(10) Patent No.: US 7,346,484 B2
(45) Date of Patent: Mar. 18, 2008

(54) MONITOR MANAGER THAT CREATES AND EXECUTES STATE MACHINE-BASED MONITOR INSTANCES IN A DIGITAL SIMULATION

(75) Inventor: Fritz A. Boehm, Austin, TX (US)

(73) Assignee: Intrinsity, Inc., Austin, TX (US)

( * ) Notice: Subject to any disclaimer, the term of this patent is extended or adjusted under 35 U.S.C. 154(b) by 1312 days.

(21) Appl. No.: 10/177,527

(22) Filed: Jun. 21, 2002

(65) Prior Publication Data

US 2003/0046645 A1 Mar. 6, 2003

Related U.S. Application Data

(60) Provisional application No. 60/302,599, filed on Jul. 2, 2001.

(51) Int. Cl.
*G06F 17/50* (2006.01)
*G06F 9/45* (2006.01)
*G06F 3/00* (2006.01)

(52) U.S. Cl. .............................. 703/16; 703/22; 716/5; 715/768; 715/771

(58) Field of Classification Search ................ 703/13, 703/15, 16, 22; 716/5, 18; 715/764, 768, 715/771; 709/217, 223; 717/124–135
See application file for complete search history.

(56) References Cited

U.S. PATENT DOCUMENTS 5,333,183 A * 7/1994 Herbert ................. 379/112.07

| | | | |
|---|---|---|---|
| 6,275,785 B1 * | 8/2001 | Currie et al. ................. 703/13 |
| 6,594,803 B1 * | 7/2003 | Weber et al. ................. 716/5 |
| 6,639,687 B1 * | 10/2003 | Neilsen ...................... 358/1.14 |
| 6,889,180 B1 * | 5/2005 | Weber et al. ................. 703/16 |
| 2002/0040285 A1 * | 4/2002 | Boehm ......................... 703/2 |

OTHER PUBLICATIONS

Madni et al., A. Intelligent Interface for Remote Supervision and Control of Underwater Manipulation, IEEE, OCEANS, vol. 15, Aug. 1983, pp. 106-110.*
Mulford, J.O. The Application of Software Monitor Data to Simulation, Proceedings of the 1st Symposium on Simulation of Computer Systems, Jun. 1973, pp. 163-170.*

(Continued)

*Primary Examiner*—Russell Frejd
(74) *Attorney, Agent, or Firm*—Matthew J Booth & Associates PLLC; Matthew J Booth

(57) ABSTRACT

The monitor manager manages the execution of monitors during the simulation of a digital design. The monitor manager (20) includes an instance generator (32) that creates executable instances (38) of monitors that may be time-dependent monitors, an activation manager (34) that assigns instances to be active or inactive, and an execution unit (36) that executes active instances and receives returned status values passed, failed, active, or error. Executable instances of time-dependent monitors are software state machines having a state variable, one or more time-dependent variables, and at least two state-driven code blocks, at least one of which might be either a cycle-dependent code block that tests for a specific cycle-dependent condition, or an event-dependent code block that tests for a specific event-dependent condition. In either case, the state-driven code block increments the time-dependent variable, and, when the condition has been satisfied, increments the state variable.

12 Claims, 6 Drawing Sheets

OTHER PUBLICATIONS

Miller et al., J.A. Simulation Modeling Within Workflow Technology, Proceedings of the 27th Conference on Winter Simulation, Dec. 1995, pp. 612-619.*

Fabre et al., M. Monitoring Manufacturing System Behavior by Continuous Discrete-Event Simulation, Proceedings of the 25th Conference on Winter Simulation, Dec. 1993, pp. 1339-1346.*

Kleinfeldt et al., S. Design Methodology Management, Proceedings of the IEEE, vol. 82, No. 2, Feb. 1994, pp. 231-250.*

Schaeffer et al., J. The Enterprise Model for Developing Distributed Applications, IEEE, Parallel & Distributed Technology: Systems and Applications, vol. 1, No. 3, Aug. 1993, pp. 85-96.*

U.S. Patent Application "Method and Apparatus that Reports Multiple Status Events with a Single Monitor". Inventors: Weber et al. U.S. Appl. No. 09/406,016, filed on Sep. 24, 1999.

U.S. Patent Application "Method and Apparatus for a Monitor that Detects and Reports a Status Event to a Database". Inventors: Weber et al. U.S. Appl. No. 09/406,017, filed Sep. 24, 1999.

U.S. Patent Application, "Grid that Tracks the Occurence of a N-Dimensional Matrix of Combinatorial Events in a Simulation Using a Linear Index". Inventor: Fritz A. Boehm; U.S. Appl. No. 09/966,049, filed on Sep. 28, 2001.

* cited by examiner

MONITOR MANAGER THAT CREATES AND EXECUTES STATE MACHINE-BASED MONITOR INSTANCES IN A DIGITAL SIMULATION

This application claims the benefits of the earlier filed U.S. Provisional Application Ser. No. 60/302,599, filed 2 Jul. 2001 (2 Jul. 2001), which is incorporated by reference for all purposes into this specification.

BACKGROUND OF THE INVENTION

1. Field of the Invention

The present invention relates to design verification in the digital computing field. More particularly, the present invention relates to a coverage analysis tool and method that manages the initiation and execution of multiple concurrent software monitors that run during simulation testing of a digital design.

2. Description of the Related Art

This application is related to U.S. patent app. Ser. No. 09/406,017, filed 24 Sep. 1999, now U.S. Pat. No. 6,889,180, entitled "Method and Apparatus for a Monitor that Detects and Reports a Status Event to a Database" (hereinafter, "the Monitor Patent"); U.S. patent app. Ser. No. 09/406,016, now U.S. Pat. No. 6,594,803, filed 24 Sep. 1999 (24 Sep.1999), entitled "Method and Apparatus that Reports Multiple Status Events with a Single Monitor" (hereinafter, "the Grid Patent"); and U.S. patent app. Ser. No. 09/966,049, now U.S. Pat. No. 7,099,812, filed 28 Sep. 2001, entitled "Grid That Tracks the Occurrence of a N-Dimensional Matrix of Combinatorial Events in a Simulation Using A Linear Index" (hereinafter, "the Grid Patent II"), all of which are incorporated by reference for all purposes into this specification and referred to collectively as "the related patents."

As described in detail in the related patents, digital designs perform a finite number of logical functions or operations, either alone or in combinations, where each specific event or combination of events is called a state. For instance, a typical digital design such as a microprocessor might support four separate operations called addition (a), multiplication (m), subtraction (s), and division (d). Within each operation, different specific events may occur. For instance, addition of two negative numbers may occur, or addition of two positive numbers may occur. In more complex designs, events may happen serially so that the number of states is increased. For instance, the operation sequence addition-multiplication-division (amd) is a different state than the operation sequence addition-multiplication-subtraction (ams). More states exist in the digital design when each a, m, s, and d operation supports various types of operands (i.e., positive, negative, and zero). Each permutation combining possible specific events results in a different state.

The related patents describe the difficulty of verifying such modern digital designs, and explain that such verification difficulty results from the designs' ability to attain an almost incalculable number of states. Consequently, designers have developed methods that verify a subset of the (hopefully interesting) states achievable by a digital design. The subset of states verified is selected with an eye to achieving a reasonable degree of test coverage. To gain an adequate level of confidence that the design is functioning correctly, it is necessary to verify whether the design attains all of the interesting states in the subset during operation or simulation.

As discussed in the related patents, verification of digital designs is usually done using a simulator. A simulator is a program that runs the design file of a digital design in order to recreate how the design would perform on a computer chip. A common method for generating test stimulus is to use a random, or directed random, test case generator. Those skilled in the art understand the many advantages and few disadvantages of random test generation, some of which are briefly discussed in the related patents. In connection with one of the disadvantages of random testing, the related patents explain the need for coverage analysis tools that quantify the percentage of the existing design states that have been hit during random testing, and describe some of the difficulties with current coverage analysis tools and the coverage data that such current tools generate. The related patents then disclose tools and methods that can be used to monitor simulation-based verification testing of a digital design. The related patents describe, in general, a computer program called a monitor that checks a design under simulation for a set of specific, predefined verification events, and a computer program called a grid that checks a design for specific combinations of events. If the monitor or grid detects a specific event or combination of events, that information is reported to a database.

The related patents describe how monitors and grids are constructed using a monitor language that, in a preferred embodiment, uses existing C++ constructs as an initial foundation, and adds a set of keywords that simplify the identification of the types of verification events that a monitor or grid will need to examine. The monitor language provides a straightforward method for a user to create a software monitor or grid that is easily converted by a parser into a standard higher-order software language such as the C++ language. The C++ code is then compiled and dynamically or statically linked into the simulation environment. The simulation environment includes software that evaluates each monitor during every simulation cycle and tracks how many times each monitor evaluates to true during a simulation. At the end of the simulation, the simulation environment summarizes this coverage information and logs it in a database for future analysis.

The monitor language keywords support the construction of monitors and grids that are capable of detecting whether certain specified events occur at all, whether two or more specified events occur simultaneously, and whether two or more events occur during a specified time period or in a specific order during a specified time period. For example, the related patents describe how the keyword assert is used to check whether a logic expression is true. If an expression is true, execution of The monitor continues. If false, execution is halted and an error condition is flagged. The related patents also describe the use of the keywords wait and expect. Wait statements stall the execution of the monitor for a predetermined number of clock cycles to allow for the observation of design behavior over the stall period. Expect statements provide a time window within which an expression is tested. If the expression evaluates true within the time window, the monitor continues execution. If the expression does not evaluate true during the time window, the monitor exits without recording a hit. These capabilities present challenges in a typical simulation of a complex digital design, where, during a given time window, dozens of different processor states of interest are possible. To detect these different interesting states, a developer might need to have several monitors or grids executing simultaneously, some of which will include time-dependent verification events such as those described above. However, it is generally not feasible, from a computing resource standpoint, to run a monitored simulation that includes a number of monitors or grids executing in multiple, simultaneous execution threads. While execution threads can provide a handy way to either share parts of a program across multiple processing units or to suspend execution of code while waiting for an event, the multiple thread calls that would be required for the simultaneous execution of multiple monitors, particularly those that include time dependencies, would result in an unacceptable performance cost.

To illustrate the problem, consider a monitor A set up to detect the situation where signal A holds certain value a, followed two cycles later by signal B holding certain value b in a cycle-based simulation of a processor. Assume further that the bulk of the cycle-based simulation comprises a call to one function that cycles the entire model. To detect the specified event, the simulation environment needs to somehow "remember" what has happened on previous cycles with respect to the value of signal A. When the simulation environment executes the monitor check function each cycle, the observed processor state is the state achieved during that cycle only. To detect the specified event, the simulation environment needs to maintain state information to remember what has happened on previous cycles.

Those skilled in the art will recognize that threads would solve the problem of maintaining the state observed by the monitor. The monitor program could run until it needs to wait a cycle to proceed. The operating system would then be called to suspend the thread until after the next call to the cycle-based simulator. In this way the state of the monitor program would be preserved from cycle to cycle.

Continuing with the above example, suppose monitor A detects that at time $T_0$, signal A holds value a. It now needs to wait two cycles and then check the value of signal B. One way to accomplish this is to use a semaphore. After monitor A finds that signal A=a during a cycle, the semaphore "stalls" execution of the thread for the proper amount of time (2 cycles in this example), at which time execution can resume and the value of signal B can be checked. Unfortunately, this process requires a minimum of two thread calls every processor cycle while the semaphore is active: the first, which calls the function that steps the simulator to the next cycle, and the second, which calls the monitor to check whether the semaphore has timed out.

Expanding the problem, suppose that at time $T_1$, signal A again holds value a, and that at time $T_3$, 2 cycles later, signal B holds value b. This is the event that monitor A is set up to detect. However, as described above, monitor A was stalled at time $T_1$, waiting for the appropriate time to elapse after $T_0$ to check the value of signal B. If monitor A is the only instance of the example monitor that is running during the simulation, the event that the processor designer wants to detect will go unnoticed. To avoid this situation, another instance of monitor A must be executing during the simulation to check the value of signal A at time $T_1$. As this example demonstrates, it is difficult to achieve 100% detection of time-based verification events in a simulation using threads and semaphores. One way to insure detection is to initiate a new instance of monitor A every cycle of the simulation. Another way is to track the status of existing executing monitors, and initiate new instances only when all current instances are stalled or otherwise unable to check for their conditions of interest. Either approach could potentially result in hundreds of execution threads, particularly in a simulation where multiple monitors are desired to detect different time-based verification events, requiring potentially hundreds of thread calls every cycle. Because of the multiple instances required, this thread-based approach yields such a severe performance penalty that it is unusable, even for simulations where only one monitor containing time-dependent verification events is implemented. Running a simulation that includes the simultaneous execution of multiple time-dependent monitors in this manner is clearly out of the question.

The present invention solves this problem. The present invention comprises a monitor manager used in the simulation environment that first creates executable monitors and grids from the monitors and grids described in the high-level monitor language, then schedules and manages the efficient execution of the required instances of each monitor and grid during the simulation, and finally, maintains hit statistics. The monitor manager converts each monitor and grid that includes time-dependent verification events into a state machine capable of suspending execution for a time, and then resuming execution at the point where it "left off." This state machine approach enables time-dependent monitors to be executed without using threads, thus avoiding the enormous overhead associated with thread calls. In addition, the monitor manager avoids the need for redundant creation and execution of identical instances of monitors and grids to insure 100% detection of specified verification events.

SUMMARY OF THE INVENTION

The present invention comprises a monitor manager method and apparatus that manages the execution of one or more monitors during the simulation of a digital design. The monitor manager includes an instance generator, an activation manager, and an execution unit. The instance generator creates at least one executable instance of each monitor that returns one of the following status variable values: passed, failed, active, or error. Each executable instance includes a reset function and a variable class construct that includes the monitor's status variable.

The activation manager assigns each executable instance to be an active executable instance or an inactive executable instance. The execution unit executes each active executable instance, receives the status value returned by each active executable instance, and maintains a hit count, which may comprise a tally of events detected by all executable instances of all monitors executed during a simulation, a tally of events detected by all executable instances of all monitors executed during a single test performed within a simulation, or a tally of events detected by all executable instances of any one monitor executed during a simulation.

In some embodiments, the monitor may be a time-dependent event monitor, in which case the corresponding executable instance further comprises a software state machine having a state variable, one or more time-dependent variables, and at least two state-driven code blocks. The time-dependent event monitor can be a monitor that detects two or more specific simulation events separated in time by a certain number of simulation cycles. In the executable instance of this type of time-dependent monitor, at least one of the state-driven code blocks may further comprise a cycle-dependent code block that tests for the cycle-dependent condition identified in the time-dependent event monitor, increments the time-dependent variable, and increments the state variable when the cycle-dependent condition has been satisfied. Alternatively, the time-dependent event monitor can be a monitor that detects two or more specific simulation events separated in time by a certain number of other simulation events. In this case, at least one of the state-driven code blocks may further comprise an event-dependent code block that tests for the event-dependent condition identified in the time-dependent event monitor, increments the time-dependent variable, and increments the state variable when the event-dependent condition has been satisfied.

When the activation manager assigns an inactive executable instance to be an active executable instance, the reset function initializes the status variable, the state variable, and the time-dependent variables within the reassigned executable instance.

DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

Figure 1:
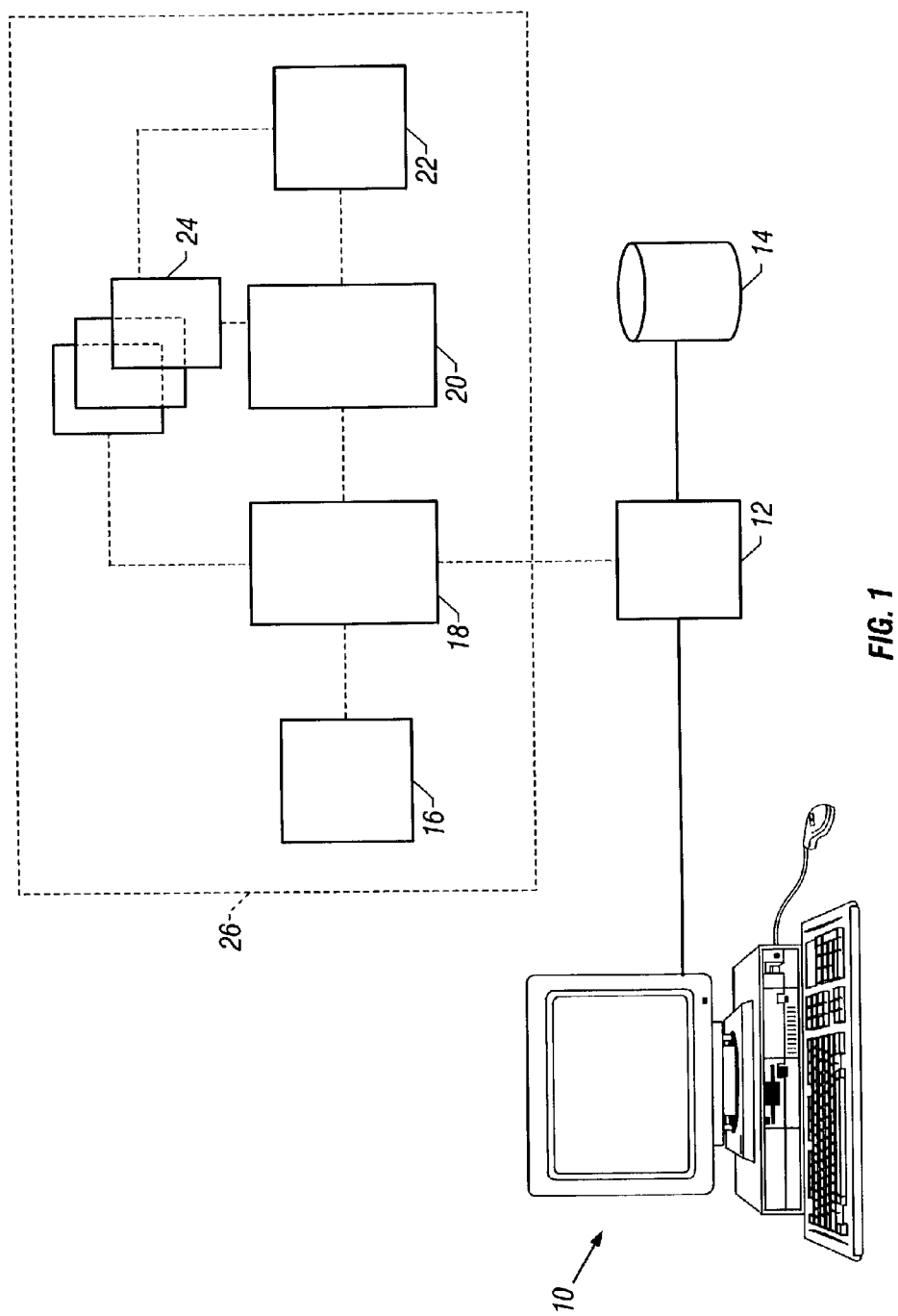
FIG. 1 illustrates the use of the present invention in a simulation of a digital design running on a typical networked simulation workstation.

The present invention is a monitor management method and apparatus used in the simulation environment that first creates executable instances of monitors and grids from monitors and grids described in a high-level monitor language, then schedules and manages the efficient execution of selected monitor and grid instances during the simulation, and finally, maintains hit statistics. The monitor manager converts each monitor and grid that includes lime-dependent verification events into a state machine capable of suspending execution for a time, and then resuming execution at the point where it "left off." In this specification, the term "time-dependent monitor" refers to a monitor that detects time-dependent verification events, such as a monitor running in a cycle-based or event-based simulation that uses one or more wait statements or expect statements as described above. In addition, the term "time-dependent monitor" also includes monitors running in event-driven simulations that detect, for example, specific event A, followed some number of events later by specific event B. In either case, the monitor manager must stall the execution of the time-dependent monitor for a period of time to allow for the observation of design behavior over some number of processor cycles or some number of defined events. The monitor manager's state-machine approach enables the execution of time-dependent monitors without using threads, thus avoiding the enormous overhead associated with thread calls. In addition, the monitor manager avoids the need for redundant creation and execution of identical instances of monitors and grids to insure 100% detection of specified verification events.

This disclosure describes numerous specific details that include exemplary structures, code fragments and pseudocode in order to provide a thorough understanding of the present invention. One skilled in the art will appreciate that one may practice the present invention without these specific details. Additionally, this disclosure does not provide a detailed description of well-known object-oriented software language characteristics, syntax, and techniques to avoid obscuring the present invention.

In this specification, unless otherwise specifically indicated, individual monitors and grids are referred to in the generic sense as "monitors," although, as described in the related patents, a "monitor" detects and reports the occurrence of a single status event, and a "grid" is capable of detecting a group of related or unrelated events and reporting the group as a single reportable event. Since the monitor manager of the present invention handles monitors and grids identically, the generic noun "monitor" is used herein to avoid obfuscation of the present invention. Similarly, in this specification, the phrases "clock cycle", "processor cycle", and "simulation cycle" are used interchangeably, and those skilled in the art recognize that in the context of a cycle-based simulation environment, all three terms generally refer to one simulation cycle.

FIG. 1 illustrates the use of the present invention in a simulation of a digital design running on a typical simulation workstation 10 coupled to a server 12, which is in turn coupled to a shared storage device 14. Server 12 interfaces to the simulation environment 26 and provides the facilities with which to run the simulation. Simulation environment 26 includes the simulated design 16, the simulator and random test case generator 18, the monitor manager 20, one or more monitors and grids 24, and the database 22. When the simulation is run, the simulator and random test case generator 18 interfaces with the simulated design 16 to generate test stimuli and simulate the design's response. The monitor manager 20 creates and initiates executable instances of monitors and grids 24, which monitor the simulation and report results to the monitor manager 20 and to the database 22.

Figure 2:
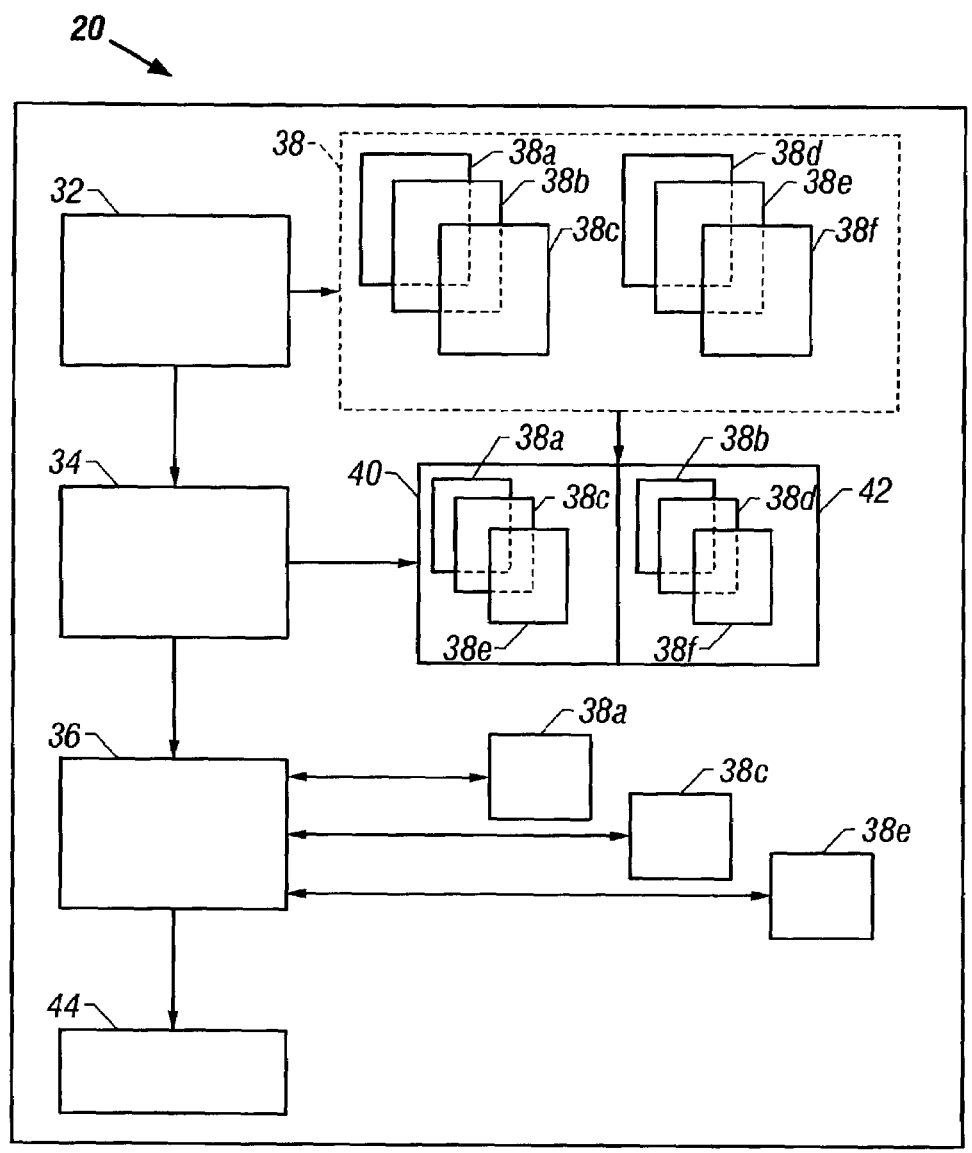
FIG. 2 is a high-level functional block diagram of the monitor manager according to one embodiment of the present invention.

FIG. 2 is a high-level functional block diagram of the monitor manager 20, according to one embodiment of the present invention. In FIG. 2, monitor manager 20 includes an instance generator 32, an activation manager 34, and an execution unit 36. Instance generator 32 generates at least one executable instance 38a, 38b, 38c, 38d, 38e, and 38f of each monitor and grid originally created in the high-level monitor language described in the related patents. Instance generator 32 preferably includes a parsing function that parses the monitor language keywords described in the related patents into standard higher-order software language code constructs such as standard C++ code as described in the related patents. As described in detail below, in creating executable instances 38, instance generator 32 handles time-dependent monitors different from monitors that simply detect a certain event or simultaneous group of events, by creating special state-based executable instances for time-dependent monitors.

Activation manager 34 assigns each executable instance to be an active executable instance 40 or an inactive executable instance 42. In the example shown in FIG. 2, executable instances 38a, 38c, and 38e are active executable instances 40, and executable instances 38c, 38d, and 38f are inactive executable instances 42. Execution unit 36 executes active executable instances 38a, 38c, and 38e, receives their results, and maintains hit count 44.

Figure 3:
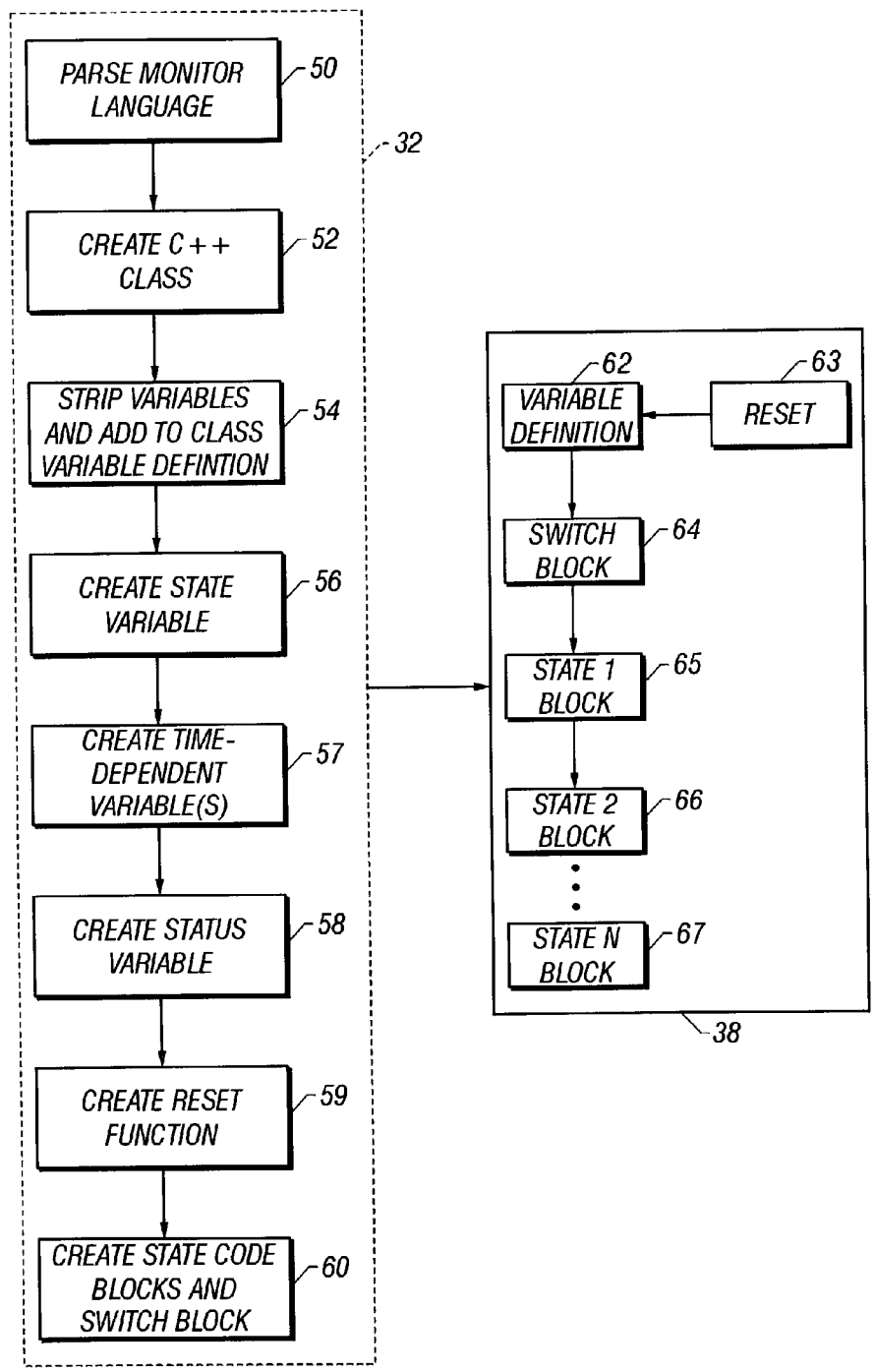
FIG. 3 is a flowchart showing the generation of an executable instance of a typical time-dependent monitor, along with a conceptual block diagram showing the major features of the executable instance.

FIG. 3 is a flowchart showing the process the instance generator 32 uses to generate an executable instance 38 of a typical time-dependent monitor described in high-level monitor language, and a conceptual block diagram of the executable instance 38 showing its major features. The flowchart in FIG. 3 is provided to illustrate the major functions of the instance generator 32, and unless otherwise indicated in the text, is not intended to imply or suggest a specific or necessary order in which those functions must be performed. Similarly, in FIG. 3, the functional blocks within the typical executable instance 38 simply illustrate major functional features within a typical executable instance of a time-dependent monitor. The depiction of the functional blocks within the executable instance 38 is not intended to suggest or imply any particular or necessary functional order or relationship to each other. Such relationships, to the extent that they are important, are described in the text accompanying FIG. 3. The process illustrated in FIG. 3 and explained in the accompanying text is further illuminated by an example provided below.

Turning to FIG. 3, at 50, the instance generator 32 parses the monitor language to create standard C++ constructs as described in the related patents. At 52, the instance generator creates a C++ class that comprises the entire executable instance 38. In so doing, initialization-type functions within the monitor that are only performed once (e.g., connecting to a signal for logic expression evaluation), are placed in the constructor of the function. At 54, the instance generator 32 strips variable declarations from the code and redefines the monitor variables (such as axis, signal, and bus variables as described in the related patents) to be class variables 62. At 56, 57, and 58, state, time-dependent, and status variables are created and added to the class variable definitions 62. At 59, the instance generator creates a reset function 63 for the executable instance's variables. Those skilled in the art will recognize that these steps encapsulate the executable instance's variables and state, allowing the variables and state to maintain their values over successive calls to the instance's execute function.

In addition, defining the entire executable instance 38 of the monitor to be an object, creating the variable class, and putting the variable initializations into the reset function 63, allows the instantiated executable instance object 38 to be used again and again by the monitor manager 20. This eliminates the need to create an instance for execution, delete it after execution, and then immediately re-create it for execution during the next cycle. Maintaining an instance as inactive until required, and then clearing its variables and reusing the instance is a much more efficient utilization of simulation resources than repeatedly creating, using, and then deleting the instance.

The instance generator 32 transforms the actual code to be executed into a state machine at 60. In the embodiment described herein, the state machine is created using a switch/case statement block with go to branches and labels. The instance generator recognizes which constructs of the monitor language keywords are time-dependent (e.g., the construct created from the wait and expect keywords, described above). The instance generator inserts labels into the code near the time-dependent constructs to create state-driven code blocks 65, 66, and 67. Each state-driven code block is identified as "label x" where x is an integer. Within each state-driven code block, the state variable is initially set to equal the value of x. Thereafter, the reportable event condition and/or the time-dependent condition defined in the monitor language keyword construct is checked and the axis variables and/or status variable and/or time-dependent variables are set accordingly, as explained in further detail below. Finally, the value of the state variable is incremented where appropriate.

At 60, the instance generator 32 also creates the switch block 64 as the first piece of code in the execute function. The switch block 64 uses the current value of the state variable to go to the appropriate state-driven code block, given the current state of the executable instance 38.

The following example shows an executable instance 38 created by the instance generator 32 of the present invention from a simple time-dependent monitor shown in Table 1. The monitor ARITH_INSTR shown in Table 1 is a time-dependent monitor that detects the occurrence of a specific arithmetic instruction a certain period of time after a specific signal is found to be valid.

TABLE 1

```
// monitor declaration
monitor (ARITH_INST)
{
// set up the instruction axis
axis(0) = ADD, SUB, MULT, DIV;
// declare axis variables of each enumerated type
axis_0 instr;  // axis_0 is an enumerated type with the values ADD=0,
               SUB=1,
               // MULT=2, DIV=3
// declare signals
signal *valid = "top.dispatch.op_valid_2h1";
signal *stall = "top.dispatch.stall_2h1";
signal *opcode = "top.dispatch.opcode_4h1";
// logical expressions
if (*valid !=V1)
    return false;
wait 2 (*stall == V0);
if (*opcode == V0) instr = ADD;
else if (*opcode == V1) instr = SUB;
else if (*opcode == V2) instr = MULT;
else if (*opcode) == V3) instr = DIV;
else return false;
grid_return(instr);
}
```

Those skilled in the art and familiar with the monitor language and monitors described in the related patents will recognize that this monitor exits immediately if the specific signal (designated as "top.dispatch.op_valid_2h1" in the design that this monitor is examining) is not found to be valid, because no reportable event can be detected if the signal is not valid. (As the reader may recall from the related patents, in the monitor language, the signal declaration defines a variable name local to the monitor which is a pointer to a signal in the design. The character string in quotes is the full hierarchical name of the signal in the design.)

On the other hand, if the signal "top.dispatch.op_valid_2h1" is found to be valid, the monitor then checks the value of timing signal "top.dispatch.stall_2h1." After that signal is true twice—not necessarily on consecutive processor cycles—the monitor then checks signal "top.dispatch.opcode_4h1" for a specific opcode indicated by its value; if the opcode is found after "top.dispatch.stall_2h1" has been true twice the axis variable is set to the proper opcode, the monitor returns, and a reportable event is logged. If the dispatch signal is valid but the opcode is not found after "top.dispatch.stall_2h1" has been true twice, the monitor has not detected a reportable event and it exits.

Table 2 below shows a portion of the executable instance that the instance generator 32 of the present invention generates from the Table 1 monitor.

TABLE 2

```
void ARITH_INST::execute( ) {
// switch block that directs execute to state-driven code block according to
   last state
   switch(curState)
   {
   case 0:
      goto label_0;
   case 1:
      goto label_1;
   case 2:
      goto label_2;
   default:
      goto default_label;
   }
// state-driven code block for state 0
   label_0:
      curState = 0;
   if (*valid != V1)
   {status = FAILED; return;}
      curState++;
// state-driven code block for state 1
   label_1:
      curState = 1;
      if ((*stall == V0))_foo_wait_0++;
      if (_foo_wait_0 >= 2) curState++;
      if (_foo_wait_0 <= 2)
      return;
// state-driven code block for state 2
   label_2:
      _foo_wait_0 = 0;
      curState = 2;
   if (*opcode == V0)
      instr = ADD;
   else if (*opcode == V1)
      instr = SUB;
   else if (*opcode == V2)
      instr = MUL;
   else if (*opcode == V3)
      instr = DIV;
   else
      {status = FAILED; return;}
      {gridReturn(instr); status = PASSED; return;}
// state-driven code block for default state, where an error has occurred
   and the monitor has // no known state
      default_label:
         IGridIndex = 0;
         status = FAILED;
         return;}
// end execute function for ARITH_INST
```

Note the generated state-driven code block lines. The lines:

if ((*stall==V0))_foo_wait_0++;
   if (_foo_wait_0>=2) curState++;
   if (_foo_wait_0<=2)

in the executable instance portion shown in Table 2 are generated from the "wait 2 (*stall==V0)" line in the Table 1 monitor. When the monitor executes the first time, the state variable curState is initialized to 0 by the executable instance's reset function (not shown in Table 2). The switch code block directs execution to the state-driven code block for state 0, and the monitor checks the value of the dispatch signal to determine whether it is valid. If it is not a valid signal, a reportable event is not detected, the status variable is set to "failed" and the executable instance returns a "failed" status value to the monitor manager, indicating that no reportable event was detected. On the other hand, if the dispatch signal is found to be valid, the state variable, curState, is incremented, setting its value to "1." Execution continues to the state-driven code block corresponding to state 1, and the monitor begins the stall process. The monitor checks the value of top.dispatch.stall_2h1, and if it is true (corresponding to value=V0), the monitor increments the time-dependent variable (foo_wait, in this example) that had been initialized to zero in the reset function. Thereafter, the monitor checks the value of foo_wait, and if it is greater than or equal to 2, the state variable is incremented and execution returns. If foo_wait is not greater than or equal to 2, the state variable is not incremented, because top.dispatch.stall_2h1 has not been true twice. Regardless, the monitor still returns.

To illustrate how the monitor holds its state upon subsequent execution calls, assume that the executable instance shown in FIG. 2 is activated. Its reset function (not shown in FIG. 2) initializes the instance's status variable "status" to "ACTIVE", its state variable "curState" to "0," and its time-dependent variable "foo_wait" to "0." The instance thus begins execution with status=ACTIVE, at state 0, with foo_wait equal to to 0. Assume that the monitor finds that the dispatch signal is valid, thus incrementing state to 1. Assume further that the monitor finds top.dispatch.stall 2h1 to be true (holding value V0) and foo_wait is therefore incremented to 1. At this point, the monitor returns with its status variable still set to ACTIVE. The next time the monitor manager calls the executable instance's execution function, the switch block directs execution to the state-driven code block corresponding to state 1, because that is the current value of curState. The monitor checks the value of the stall signal, and for this example, we will assume it is true. Foo_wait is thus incremented to 2, curState is incremented to 2, and the monitor again returns with status still set to ACTIVE. At the next execution call, the switch block directs execution to the state-driven code block corresponding to state 2, which reinitializes foo_wait and the opcode signal value is checked. If the monitor finds a valid opcode, the axis variable "instr" is set and the monitor returns with the axis variable set and the status variable now set to "PASSED," thus indicating a reportable hit. As this example shows, this executable instance of the example time-dependent monitor maintained its state over three execution calls, and detected a reportable verification event that included specific events occurring over a certain period of time in relation to each other.

After reading this specification and/or practicing the present invention, those skilled in the art will recognize that the instance generator 32 of the current invention uses these state-related and count-related techniques to transform time-dependent monitors expressed in the high-level monitor language to executable instances of software state machines capable of monitoring and detecting a series of time-related verification events. In the example shown above, the state-driven code block corresponding to state 1 is also an event-dependent code block, because it tests for the event-dependent condition identified in the time-dependent event monitor (e.g., the condition where the stall signal has been valid at least two times), increments the time-dependent variable if it finds that the condition has not been satisfied, and increments the state variable when the event-dependent condition has been satisfied.

Suppose, however, that the wait statement in the Table 1 monitor had been "wait 50 clock;" instead of "wait 2 (*stall==V0);". In this case, the verification event that the monitor is set up to detect is the situation where signal "top.dispatch.op_valid_2h1" is found to be valid, and then 50 processor cycles later, signal "top.dispatch.opcode_4h1" holds a value corresponding to one of four different opcodes. If the executable instance detects this situation, the axis variable is set to the proper opcode, the monitor returns, and a reportable event is logged. If the wait statement in the Table 1 monitor had been "wait 50 clock;", then the state-driven code block corresponding to state 1 created by the instance generator of the monitor manager might read as follows:

```
label_1:
   curState=1;
   foo_wait_0++;
   if (_foo_wait_0>=50) curState++;
   if (_foo_wait_0<=50)
   return;
```

In this example, as described previously, the monitor manager will direct execution to this state-driven code block whenever the state variable=1. Upon each execution cycle, the time-dependent variable foo_wait is incremented and then tested. If at least 50 clock cycles have passed, the state variable curState is incremented and the monitor manager will direct execution on the next cycle to the state-driven code block corresponding to state 2. If fewer than 50 clock cycles have passed, state does not change and the monitor manager continues to direct execution to this block and continues to increment the time-dependent variable until the time-dependent condition specified in the monitor is met. In this example, the state-driven code block corresponding to state 1 is also a cycle-dependent code block, because it tests for the cycle-dependent condition identified the time-dependent event monitor (e.g., the condition where the at least 50 cycles have occurred), increments the time-dependent variable, and increments said state variable when the cycle-dependent condition has been satisfied.

Figure 4A:
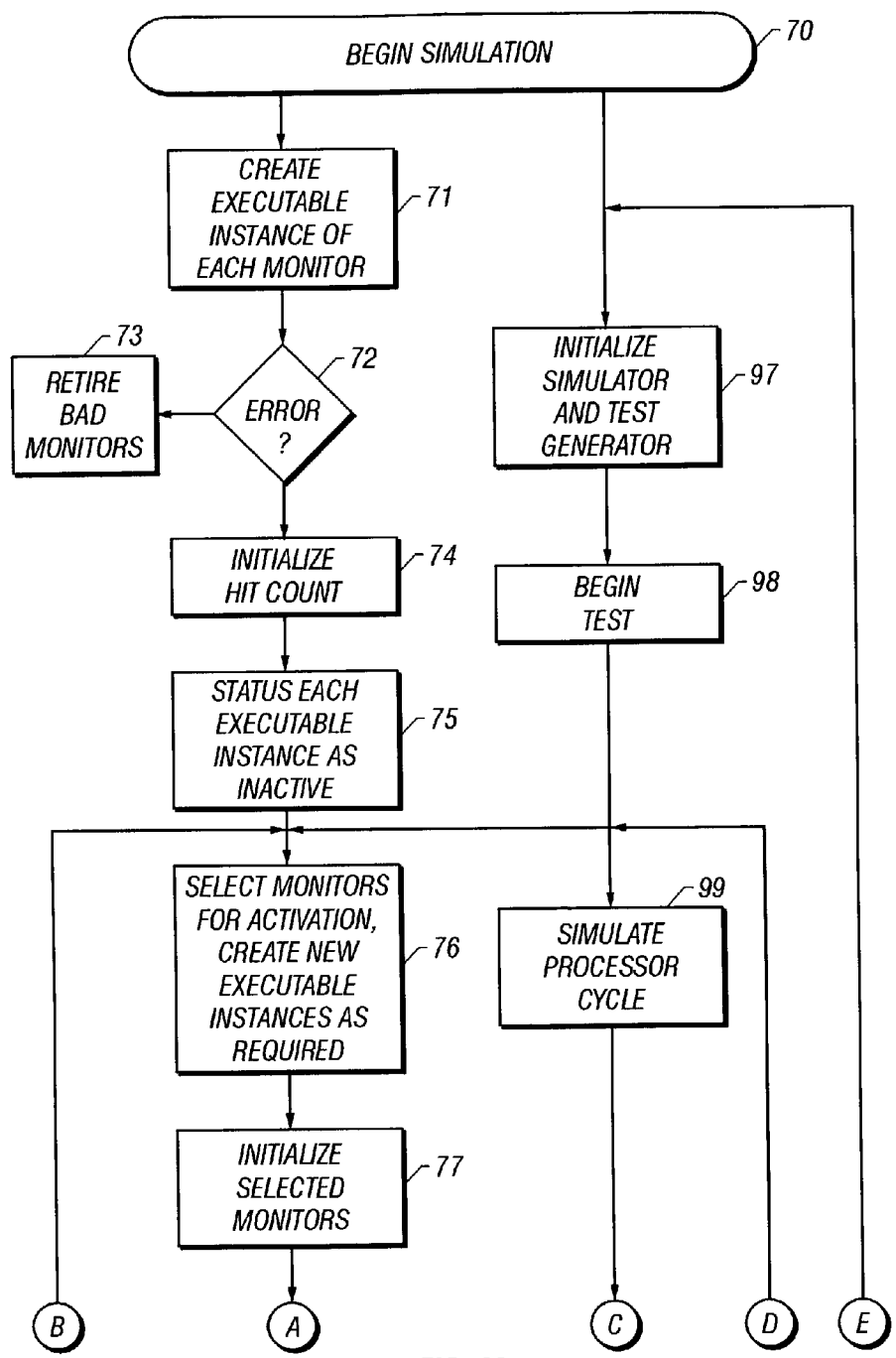
FIG. 4A–4C is a flowchart showing how the present invention manages the creation and execution of multiple monitors within the simulation environment.
Figure 4B:
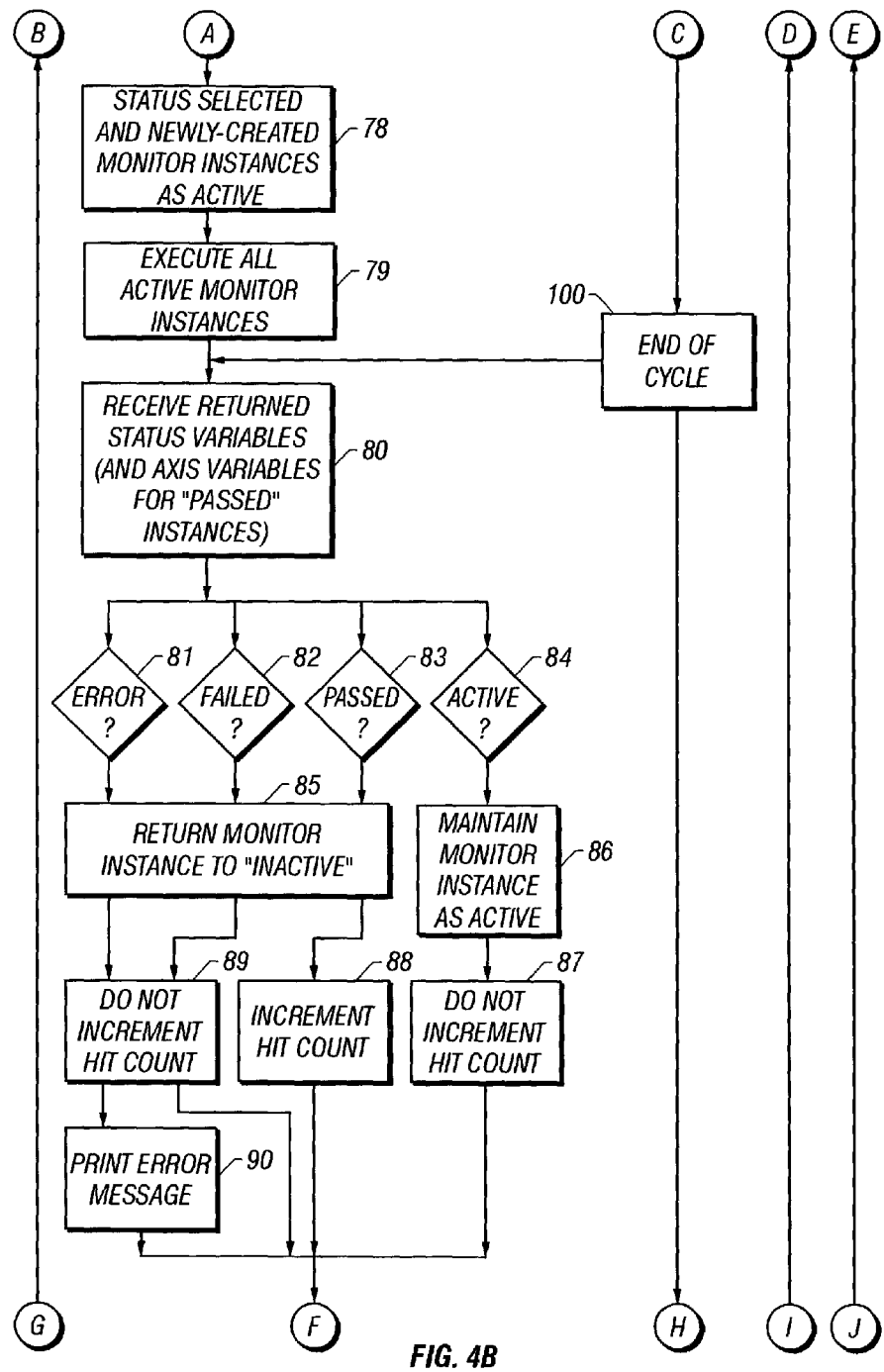
Figure 4C:
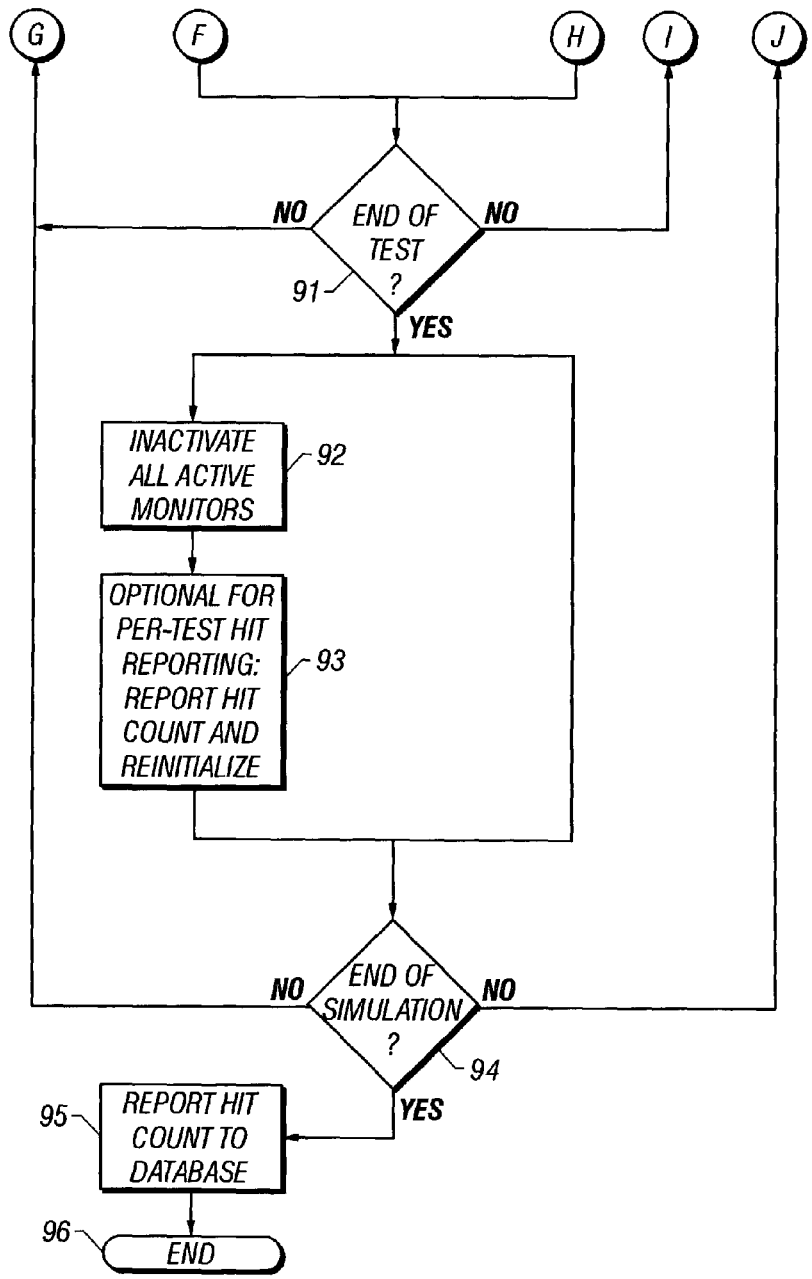

FIG. 4A–4C is a flowchart that depicts the simulation environment and shows how the present invention 20 manages the creation and execution of multiple monitors during the simulation of a digital design. While the following discussion of FIG. 4 assumes that the concurrent simulation is a cycle-based simulation, wherein the simulation proceeds by calling an execution function on a cycle-by-cycle basis, those skilled in the art will recognize that the functions described apply equally to monitor managers handling the monitoring of an event-based simulation. In addition, the activities and functions of the monitor manager are generally shown along the left-hand side of FIGS. 4A through 4C, while some of the high-level activity occurring in the simulator is shown along the right-hand side of the flowchart.

Turning to FIG. 4A, after the simulation starts at 70, the instance generator 32 of the monitor manager 20 creates executable instances of each monitor at 71. An error check occurs at 72, and any bad monitors are retired at 73, with appropriate information enabling the designer to determine the problem with the monitor. At 74, the monitor manager initializes the hit count that will be maintained for the entire simulation, and at 75, the activation manager 34 assigns each executable instance created by the instance generator to be an inactive instance. Meanwhile, the simulator initializes itself at 97 and the test generator begins generating and executing the first test to be run at 98. At 99, the simulator calls the execution function that simulates a cycle of the processor.

At 76, the monitor manager selects the appropriate executable instances for activation and execution. If a monitor needs to be run for the test that is running, but there are no inactive executable instances available, the instance generator creates a new executable instance and the activation manager assigns the new instance to be an inactive instance.

At 77, the monitor manager initializes the newly selected executable instances of the monitors that have been selected by calling their reset function. As described above, this initializes the state variable, time-dependent variables (if any) and status variable for each newly selected monitor that will be executed during this processor cycle. At 78, the activation manager reassigns each newly selected and initialized monitor from inactive to active, and at 79, the execution unit 36 executes all active monitors.

Meanwhile, at 100, the simulator reaches the end of a processor cycle. At 80, after the processor cycle ends and each active monitor has been executed and returned a status variable, the monitor manager receives the status variable, along with the axis variable set for any active monitor instance executed that returned a "passed" status variable. The tests at 81, 82, 83, and 84 each show what happens as a function of the status variable returned by each executed monitor. If the monitor returned an "error" value at 81, a "failed" value at 82, or a "passed" value at 83, the activation manager returns each executable instance to inactive at 85. As the reader will recall, an executable instance returns an error if the instance code does not execute correctly or an unexpected value is encountered. If this happens, the monitor manager does not increment the hit count at 85, because the executable instance encountered an error and was unable to detect the verification event it was designed to detect. Instead, the monitor manager flags the error for later analysis at 90.

If a "failed" value is returned, shown at 82, the executable instance ran correctly but did not detect the verification event. Consequently, the monitor manager does not increment the hit count. However, if a "passed" value is returned at 83, then the executable instance did detect a verification event, as specified by the axis variable set and returned by the executable instance. In this case, at 88, the monitor manager does increment the hit count corresponding to the event indicated by the axis variable. In all three of these cases, however, the executable instance either failed to execute correctly (the "error" condition described above) or completed execution (the "failed" and "passed" conditions described above), and can thus be inactivated by the activation manager.

At 84, if an executable instance returns an "active" status variable value, that means that the instance is a time-dependent monitor looking for a verification event defined as one or more specific events separated by time. In this case, the monitor manager wants to maintain the state of the executable instance across one or more processor cycles, so the activation manager maintains the executable instance as an active instance at 86. The hit count is not incremented at 87, because the monitor manager does not "know" if the defined verification event will be detected until the active instance returns a value of either "passed" (indicating the time-dependent event was detected) or "failed" (indicating the time-dependent event was not detected.) At this stage, all executable instances executed this cycle of the simulation have finished executing, and are either inactive or active. If the simulation environment determines that the test being run is not complete at 91, the simulator returns to the simulation execution function to simulate another processor cycle at 99. Simultaneously, the monitor manager returns to 76, to select executable instances to run during the next processor cycle, choosing from among the inactive instances listed by the activation manager, and creating new instances as required. Note that the monitor manager may select inactive instances that were activated, executed, and either failed or passed on the immediately preceding cycle, causing them to be moved to the inactive list at the end of that cycle. Additionally, the monitor manager may need to run monitors for which there is no currently available inactive instance— such as those monitors that still have active instances that were initiated on prior cycles running. In this case, the monitor manager creates a new executable instance and places it on the inactive list. As this discussion demonstrates, it is possible that multiple executable instances of a certain time-dependent monitor could be active and running at any particular time, each one initiated during a different cycle of the simulation and potentially at a different state than other active executable instances of the same monitor.

At 77, the newly selected and newly created inactive instances are initialized. If any of the newly selected instances are, in fact, instances that executed during the last cycle, this initialization step clears the variables within the executable instance and readies it to execute again. The selected inactive instances are reassigned to be active instances at 78, and at 79, the execution unit executes all active monitor instances, including those that have just been selected and initialized and those that are still active from the prior cycle. Only the newly selected instances have been reinitialized; active instances that were not activated this cycle are not reinitialized and still maintain the values of their status, state, and time-dependent variables. As described above, when an executable instance remains active over several processor cycles, execution resumes at the point where it "left off" during the last cycle, as dictated by the value of the executable instance's state variable.

The simulation thus continues cycle by cycle, and for each cycle, the monitor manager selects inactive monitor instances for execution, and continues to execute instances active from prior cycles. At the end of each cycle, the simulation environment determines, at 91, whether a specific verification test within a simulation is complete. When a test is complete, at 92 the monitor manager inactivates all active executable instances remaining—which at this point, will be time-dependent monitors whose execution is stalled, waiting for a certain number of clock cycles to expire or events to occur. Inactivating stalled time-dependent monitors at the end of a test insures that a hit will not be counted if a monitor coincidentally detects its reportable verification event across test boundaries, since the tests are likely to be unrelated and the user will likely have written each monitor to detect events of interest within specific planned tests.

If the practitioner of the present invention has elected to gather hit statistics on a per-test, rather than a per-simulation basis, the monitor manager can be configured to report, at 93, the hit count to a database and then reinitialize the hit count in preparation for the next test. Those skilled in the art will recognize that this step is unnecessary if hit statistics are being gathered for the entire simulation.

At the end of each test, the simulation environment determines, at 94, whether the simulation is complete. If it is not, the simulation environment returns to 97 and reinitializes the simulator and test generator as required to prepare for the next test in the simulation, which begins at 98. Simultaneously, the monitor manager returns to 76 and begins selecting executable instances of monitors for activation and execution, and the entire process repeats. This process continues until the simulation environment determines, at 94, that all scheduled tests have been completed and the simulation is complete. At this point, the monitor manager reports, at 95, hit statistics to the database, and the monitored simulation ends at 96.

In summary, the present invention is a monitor manager method and apparatus that manages the execution of one or more monitors during the simulation of a digital design. The monitor manager includes an instance generator, an activation manager, and an execution unit. The instance generator creates at least one executable instance of each monitor that returns one of the following status values: passed, failed, active, or error. Each executable instance includes a reset function and a variable class construct that includes all axis variables declared in the monitor.

The activation manager assigns each executable instance to be an active executable instance or an inactive executable instance. The execution unit executes each active executable instance, receives the status value returned by each active executable instance, and maintains a hit count, which may comprise a tally of events detected by all executable instances of all monitors executed during a simulation, a tally of events detected by all executable instances of all monitors executed during a single test performed within a simulation, or a tally of events detected by all executable instances of any one monitor executed during a simulation.

In some embodiments, the monitor may be a time-dependent event monitor, in which case the corresponding executable instance further comprises a software state machine having a state variable, one or more time-dependent variables, and at least two state-driven code blocks. The time-dependent event monitor can be a monitor that detects two or more specific simulation events separated in time by a certain number of simulation cycles. In the executable instance of this type of time-dependent monitor, at least one of the state-driven code blocks may further comprise a cycle-dependent code block that tests for the cycle-dependent condition identified in the time-dependent event monitor, increments the time-dependent variable, and increments the state variable when the cycle-dependent condition has been satisfied. Alternatively, the time-dependent event monitor can be a monitor that detects two or more specific simulation events separated in time by a certain number of other simulation events. In this case, at least one of the state-driven code blocks may further comprise an event-dependent code block that tests for the event-dependent condition identified in the time-dependent event monitor, increments the time-dependent variable, and increments the state variable when the event-dependent condition has been satisfied.

When the activation manager assigns an inactive executable instance to be an active executable instance, the reset function initializes the state variable, the status variable, and the time-dependent variables within the eassigned executable instance, along with other monitor variables that require initialization, such as signal, bus, and axis variables.

Other embodiments of the invention will be apparent to those skilled in the art after considering this specification or practicing the disclosed invention. The specification and examples above are exemplary only, with the true scope of the invention being indicated by the following claims.

We claim the following invention:

1. A processor with a memory that produces a monitor manager that manages the execution of one or more monitors during the simulation of a digital design, comprising:

an instance generator that creates at least one executable instance of each monitor, wherein each said executable instance further comprises a variable class construct that includes a status variable declared in said monitor and a reset function, each said executable instance returns with said status variable set to one of the following values: passed, failed, active, or error;

an activation manager that assigns each said executable instance to be an active executable instance or an inactive executable instance;

an execution unit that executes each said active executable instance, receives said status variable value returned by each said active executable instance, and maintains a hit count; and wherein the result is a monitor manager that manages the execution of one or more monitors during the simulation of a digital design.

2. A method that produces a monitor manager that manages the execution of one or more monitors during the simulation of a digital design, comprising:

providing an instance generator that creates at least one executable instance of each monitor, wherein each said executable instance further comprises a variable class construct that includes a status variable declared in said monitor and a reset function, each said executable instance returns with said status variable set to one of the following values: passed, failed, active, or error;

providing an activation manager that assigns each said executable instance produced by said instance generator to be an active executable instance or an inactive executable instance;

providing an execution unit that executes each said active executable instance that was activated by said activation manager, receives said status variable value returned by each active executable instance, and maintains a hit count; and wherein the result is a monitor manager that manages the execution of one or more monitors during the simulation of a digital design.

3. A method that uses a machine that produces a monitor manager to manage the execution of one or more monitors during the simulation of a digital design, comprising:

creating at least one executable instance of each monitor, wherein each said executable instance further comprises a variable class construct that includes a status variable declared in said monitor and a reset function, each said executable instance returns with said status variable set to one of the following values: passed, failed, active, or error;

assigning each said executable instances to be an active executable instance or an inactive executable instance;

executing each said active executable instance, receiving said status variable value returned by each active executable instance, and maintaining a hit count; and wherein the result is a monitor manager that manages the execution of one or more monitors during the simulation of a digital design.

4. A program storage device readable by a machine, tangibly embodying a program of instructions executable by the machine to perform a method that uses the machine to produce a monitor manager to manage the execution of one or more monitors during the simulation of a digital design, comprising:

creating at least one executable instance of each monitor, wherein each said executable instance further comprises a variable class construct that includes a status variable declared in said monitor and a reset function, each said executable instance returns with said status variable set to one of the following values: passed, failed, active, or error;

assigning each said executable instance to be an active executable instance or an inactive executable instance;

executing each said active executable instance, receiving said status variable value returned by each active executable instance, and maintaining a hit count; and wherein the result is a monitor manager that manages the execution of one or more monitors during the simulation of a digital design.

5. A dependent claim according to claim 1, 2, 3, or 4 wherein at least one monitor further comprises a time-dependent event monitor, and said executable instance of said time-dependent event monitor further comprises a software state machine having a state variable, one or more time-dependent variables, and at least 2 state-driven code blocks.

6. A dependent claim according to claim 5, wherein said time-dependent event monitor further comprises one of the following:

a time-dependent event monitor that detects two or more specific simulation events separated in time by a cycle-dependent condition, and one of said state-driven code blocks further a comprises a cycle-dependent code block that tests for said cycle-dependent condition, increments said time-dependent variable, and increments said state variable when said cycle-dependent condition has been satisfied, or a time-dependent event monitor that detects two or more specific simulation events separated in time by an event-dependent condition, and one said state-driven code blocks further a comprises an event-dependent code block that tests for said event-dependent condition, increments said time-dependent variable, and increments said state variable when said event-dependent condition has been satisfied.

7. A dependent claim according to claim 1, 2, 3, or 4, wherein said reset function initializes said status variable within said executable instance to active when said executable instance is reassigned from an inactive executable instance to an active executable instance.

8. A dependent claim according to claim 7, wherein said reset function initializes said state variable and said one or more time-dependent variables within said executable instance when said executable instance is reassigned from an inactive executable instance to an active executable instance.

9. A processor with a memory that produces a monitor manager that manages the execution of one or more monitors during the simulation of a digital design, comprising:

an instance generator that creates at least one executable instance of at least one time-dependent event monitor that detects two or more specific simulation events separated in time by either a cycle-dependent condition or an event-dependent condition, wherein each said executable instance further comprises a software state machine that includes a status variable, a state variable, one or more time-dependent variables, and at least 2 state-driven code blocks, wherein at least one state-driven code block tests for either said cycle-dependent condition or said event-dependent condition, increments said time-dependent variable, and increments said state variable when said cycle-dependent condition or said event-dependent condition has been satisfied, said executable instance further comprises a reset function that initializes said status variable to active and initializes said state variable and said time-dependent variables when said executable instance is reassigned from an inactive executable instance to an active executable instance, said executable instance returns with said status variable set to one of the following values: passed, failed, active, or error;

an activation manager that assigns each said executable instance to be an active executable instance or an inactive executable instance;

an execution unit that executes each said active executable instance, receives said status variable value returned by each said active executable instance, and maintains a hit count; and wherein the result is a monitor manager that manages the execution of one or more monitors during the simulation of a digital design.

10. A method that produces a monitor manager that manages the execution of one or more monitors during the simulation of a digital design, comprising:

providing an instance generator that creates at least one executable instance of at least one time-dependent event monitor that detects two or more specific simulation events separated in time by either a cycle-dependent condition or an event-dependent condition, wherein each said executable instance further comprises a software state machine that includes a status variable, a state variable, one or more time-dependent variables, and at least 2 state-driven code blocks, wherein at least one state-driven code block tests for either said cycle-dependent condition or said event-dependent condition, increments said time-dependent variable, and increments said state variable when said cycle-dependent condition or said event-dependent condition has been satisfied, said executable instance further comprises a reset function that initializes said status variable to active and initializes said state variable and said time-dependent variables when said executable instance is reassigned from an inactive executable instance to an active executable instance, said executable instance returns with said status variable set to one of the following values: passed, failed, active, or error;

providing an activation manager that assigns each said executable instance produced by said instance generator to be an active executable instance or an inactive executable instance;

providing an execution unit that executes each said active executable instance that was activated by said activation manager, receives said status variable value returned by each said active executable instance, and maintains a hit count; and wherein the result is a monitor manager that manages the execution of one or more monitors during the simulation of a digital design.

11. A method that uses a machine that produces a monitor manager to manage the execution of one or more monitors during the simulation of a digital design, comprising:

generating at least one executable instance of at least one time-dependent event monitor that detects two or more specific simulation events separated in time by either a cycle-dependent condition or an event-dependent condition, wherein each said executable instance further comprises a software state machine that includes a status variable, a state variable, one or more time-dependent variables, and at least 2 state-driven code blocks, wherein at least one state-driven code block tests for either said cycle-dependent condition or said event-dependent condition, increments said time-dependent variable, and increments said state variable when said cycle-dependent condition or said event-dependent condition has been satisfied, said executable instance further comprises a reset function that initializes said status variable to active and initializes said state variable and said time-dependent variables when said executable instance is reassigned from an inactive executable instance to an active executable instance, said executable instance returns with said status variable set to one of the following values: passed, failed, active, or error;

assigning each said executable instance to be an active executable instance or an inactive executable instance;

executing each said active executable instance, receiving said status variable value returned by each said active executable instance, and maintaining a hit count; and wherein the result is a monitor manager that manages the execution of one or more monitors during the simulation of a digital design.

12. A program storage device readable by a machine, tangibly embodying a program of instructions executable by the machine to perform a method that uses the machine to produce a monitor manager to manage the execution of one or more monitors during the simulation of a digital design, comprising:

generating at least one executable instance of at least one time-dependent event monitor that detects two or more specific simulation events separated in time by either a cycle-dependent condition or an event-dependent condition, wherein each said executable instance further comprises a software state machine that includes a status variable, a state variable, one or more time-dependent variables, and at least 2 state-driven code blocks, wherein at least one state-driven code block tests for either said cycle-dependent condition or said event-dependent condition, increments said time-dependent variable, and increments said state variable when said cycle-dependent condition or said event-dependent condition has been satisfied, said executable instance further comprises a reset function that initializes said status variable to active and initializes said state variable and said time-dependent variables when said executable instance is reassigned from an inactive executable instance to an active executable instance, said executable instance returns with said status variable set to one of the following values: passed, failed, active, or error;

assigning each said executable instance to be an active executable instance or an inactive executable instance;

executing each said active executable instance, receiving said status variable value returned by each said active executable instance, and maintaining a hit count; and wherein the result is a monitor manager that manages the execution of one or more monitors during the simulation of a digital design.

* * * * *

UNITED STATES PATENT AND TRADEMARK OFFICE
CERTIFICATE OF CORRECTION

PATENT NO. : 7,346,484 B2 Page 1 of 1
APPLICATION NO. : 10/177527
DATED : March 18, 2008
INVENTOR(S) : Boehm It is certified that error appears in the above-identified patent and that said Letters Patent is hereby corrected as shown below:

In column 1, line 27, before ", entitled" delete "(24 Sep. 1999)".

In column 2, line 50, after "execution of" delete "The" and insert -- the --, therefor.

In column 5, line 41, after "includes" delete "lime" and insert -- time --, therefor.

In column 8, line 33 (Table 1), after "opcode" delete ")".

In column 10, line 15, after "equal to" delete "to".

In column 14, line 44, delete "eassigned" and insert -- reassigned --, therefor.

In column 16, line 18, in Claim 6, after "further" delete "a".

In column 16, line 26, in Claim 6, after "further" delete "a".

Signed and Sealed this

Eighth Day of July, 2008

JON W. DUDAS
*Director of the United States Patent and Trademark Office*